United States Patent
Igarashi et al.

(10) Patent No.: US 10,784,088 B2
(45) Date of Patent: Sep. 22, 2020

(54) PLASMA PROCESSING METHOD

(71) Applicant: Tokyo Electron Limited, Tokyo (JP)

(72) Inventors: Dai Igarashi, Miyagi (JP); Muneyuki Omi, Miyagi (JP); Rei Ibuka, Miyagi (JP); Takahiro Murakami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/390,323

(22) Filed: Apr. 22, 2019

(65) Prior Publication Data

US 2019/0326103 A1 Oct. 24, 2019

(30) Foreign Application Priority Data

Apr. 23, 2018 (JP) ................ 2018-082130

(51) Int. Cl.
*H01J 37/32* (2006.01)
*H01L 21/67* (2006.01)
*F25B 39/02* (2006.01)

(52) U.S. Cl.
CPC ........ *H01J 37/32568* (2013.01); *F25B 39/02* (2013.01); *H01J 37/32091* (2013.01); *H01L 21/67069* (2013.01); *F25B 2339/02* (2013.01); *H01J 2237/002* (2013.01); *H01J 2237/334* (2013.01)

(58) Field of Classification Search
CPC ........... H01J 37/32568; H01J 37/32091; H01J 2237/002; H01J 2237/334; H01L 21/67069; H01L 21/67109; F25B 39/02; F25B 2339/02; F25B 2600/2501; F25B 2400/0411; F25B 2400/0403; F25B 49/02
See application file for complete search history.

(56) References Cited

U.S. PATENT DOCUMENTS

| | | | |
|---|---|---|---|
| 2006/0213763 A1* | 9/2006 | Furuya .............. | H01J 37/32009 204/192.1 |
| 2014/0256147 A1* | 9/2014 | Watanabe ......... | H01J 37/32091 438/710 |
| 2016/0099131 A1* | 4/2016 | Kihara ................ | H01J 37/3244 216/41 |
| 2019/0131135 A1* | 5/2019 | Belau .................. | H01L 21/3065 |

FOREIGN PATENT DOCUMENTS

JP 2017-011255 A 1/2017

* cited by examiner

*Primary Examiner* — Duy Vu N Deo
(74) *Attorney, Agent, or Firm* — Pearne & Gordon LLP

(57) ABSTRACT

A plasma processing method capable of reducing an amount of deposit adhering to an upper electrode or removing the deposit from the upper electrode is provided. In the plasma processing method, the upper electrode of a capacitively coupled plasma processing apparatus is cooled. A supporting table including a lower electrode is provided within a chamber of the plasma processing apparatus. The upper electrode is provided above the supporting table. During the cooling of the upper electrode, a film of a substrate is etched by plasma generated within the chamber. The substrate is placed on the supporting table during the etching of the film. A negative bias voltage is applied to the upper electrode while the etching is being performed.

9 Claims, 8 Drawing Sheets

PLASMA PROCESSING METHOD

CROSS-REFERENCE TO RELATED APPLICATION

This application claims the benefit of Japanese Patent Application No. 2018-082130 filed on Apr. 23, 2018, the entire disclosures of which are incorporated herein by reference.

TECHNICAL FIELD

The various aspects and embodiments described herein pertain generally to a plasma processing method.

BACKGROUND

In the manufacture of an electronic device, a plasma processing is performed on a substrate. Plasma etching is known as one kind of such a plasma processing.

Described in Patent Document 1 is plasma etching as one kind of the plasma processing. In the plasma etching disclosed in Patent Document 1, plasma of a hydrogen-containing gas and a fluorine-containing gas is generated within a chamber to etch silicon oxide.

Patent Document 1 describes a capacitively coupled plasma processing apparatus as an apparatus used in the plasma etching. The capacitively coupled plasma processing apparatus is equipped with a chamber, a supporting table and an upper electrode. The supporting table is provided within the chamber. The supporting table includes a lower electrode. The upper electrode is provided above the supporting table. In the capacitively coupled plasma processing apparatus, the gas within the chamber is excited into plasma by a high frequency electric field formed between the upper electrode and the lower electrode.

Patent Document 1: Japanese Patent Laid-open Publication No. 2017-011255

In the plasma etching, a deposit may be attached to the upper electrode. Desirably, the amount of the deposit adhering to the upper electrode needs to be reduced or the deposit needs to be removed from the upper electrode.

SUMMARY

In an exemplary embodiment, there is provided a plasma processing method performed in a capacitively coupled plasma processing apparatus. The plasma processing method includes (i) cooling an upper electrode of the plasma processing apparatus in which a chamber incorporating therein a supporting table including a lower electrode is provided and the upper electrode is provided above the supporting table; (ii) etching a film of a substrate placed on the supporting table by plasma generated within the chamber during the cooling of the upper electrode; and (iii) generating a negative bias voltage in the upper electrode during the etching of the film.

In the plasma processing method according to the exemplary embodiment, since the negative bias voltage is generated in the upper electrode, positive ions in the plasma are accelerated toward the upper electrode. Further, during the etching of the film of the substrate, the upper electrode is being cooled. Accordingly, an amount of chemical species capable of etching a deposit is increased around the upper electrode, so that the deposit adhering to the upper electrode is efficiently etched. Thus, according to the present plasma processing method, the amount of the deposit adhering to the upper electrode is reduced, or the deposit is removed from the upper electrode.

A path having an inlet and an outlet is formed within the upper electrode, and the upper electrode constitutes an evaporator. A compressor, a condenser and an expansion valve are connected in sequence between the outlet and the inlet of the path. A coolant is supplied into the path via the compressor, the condenser and the expansion valve in the cooling of the upper electrode.

The plasma processing method further includes measuring an electric current flowing in the upper electrode. The deposit adhering to the upper electrode reduces the electric current flowing in the upper electrode. Thus, by measuring the electric current flowing in the upper electrode, it is possible to detect the amount of the deposit adhering to the upper electrode.

The film of the substrate contains silicon. The plasma is generated from a processing gas including carbon, hydrogen and fluorine in the etching of the film. In this exemplary embodiment, a carbon-containing deposit adhering to the upper electrode is etched by hydrogen chemical species.

The film of the substrate may be a multilayered film. The multilayered film may have multiple silicon oxide films and multiple silicon nitride films alternately stacked on top of each other.

The upper electrode comprises a ceiling plate configured to form and confine a space within the chamber. The ceiling plate is made of silicon. In the generating of the negative bias voltage, a negative DC voltage is applied to the upper electrode or a high frequency power is supplied to the upper electrode such that the negative bias voltage is generated in the upper electrode.

The upper electrode comprises a ceiling plate configured to form and confine a space within the chamber. The ceiling plate is made of silicon oxide. In the generating of the negative bias voltage, a high frequency power is supplied to the upper electrode such that the negative bias voltage is generated in the upper electrode.

As stated above, in the plasma etching, the amount of the deposit adhering to the upper electrode is reduced or the deposit is removed from the upper electrode.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
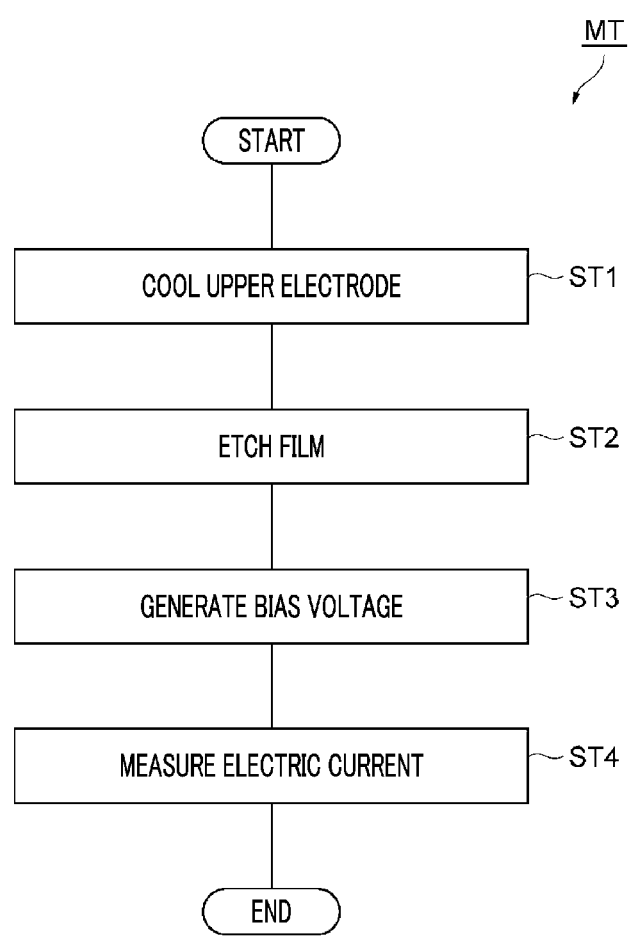
FIG. 1 is a flowchart illustrating a plasma processing method according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. In the various drawings, same or corresponding parts will be assigned same reference numerals.

Figure 2:
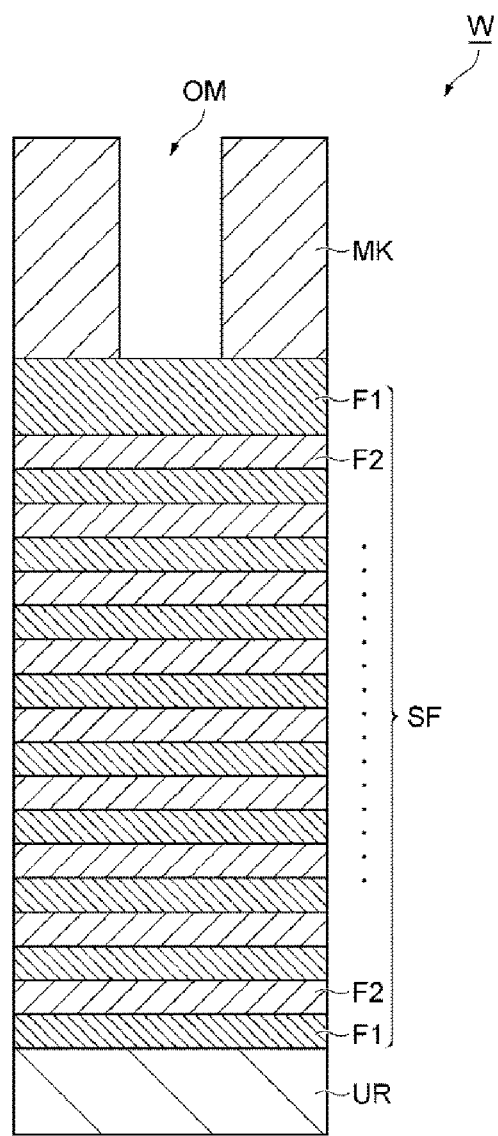
FIG. 2 is a partially enlarged cross sectional view of an example substrate.

FIG. 1 is a flowchart illustrating a plasma processing method according to an exemplary embodiment. The plasma processing method shown in FIG. 1 (hereinafter, referred to as "method MT") is performed to etch a film of a substrate. FIG. 2 is a partially enlarged cross sectional view illustrating an example of the substrate. A substrate W to which the method MT is applied has a film SF. The film SF may be of any kind. As an example, the film SF contains silicon. By way of non-liming example, the film SF is a multilayered film. The multilayered film may include a plurality of first films F1 and a multiplicity of second films F2. The first films F1 and the second films F2 are alternately stacked on top of each other. By way of example, each of the first films F1 is a silicon oxide film, and each of the second films F2 is a silicon nitride film.

The substrate W may further include an underlying region UR and a mask MK. The film SF is provided on the underlying region UR. The mask MK is provided on the film SF. The mask MK is a patterned region. The mask MK provides a pattern to be transferred to the film SF. The mask MK is provided with one or more openings OM.

Figure 3:
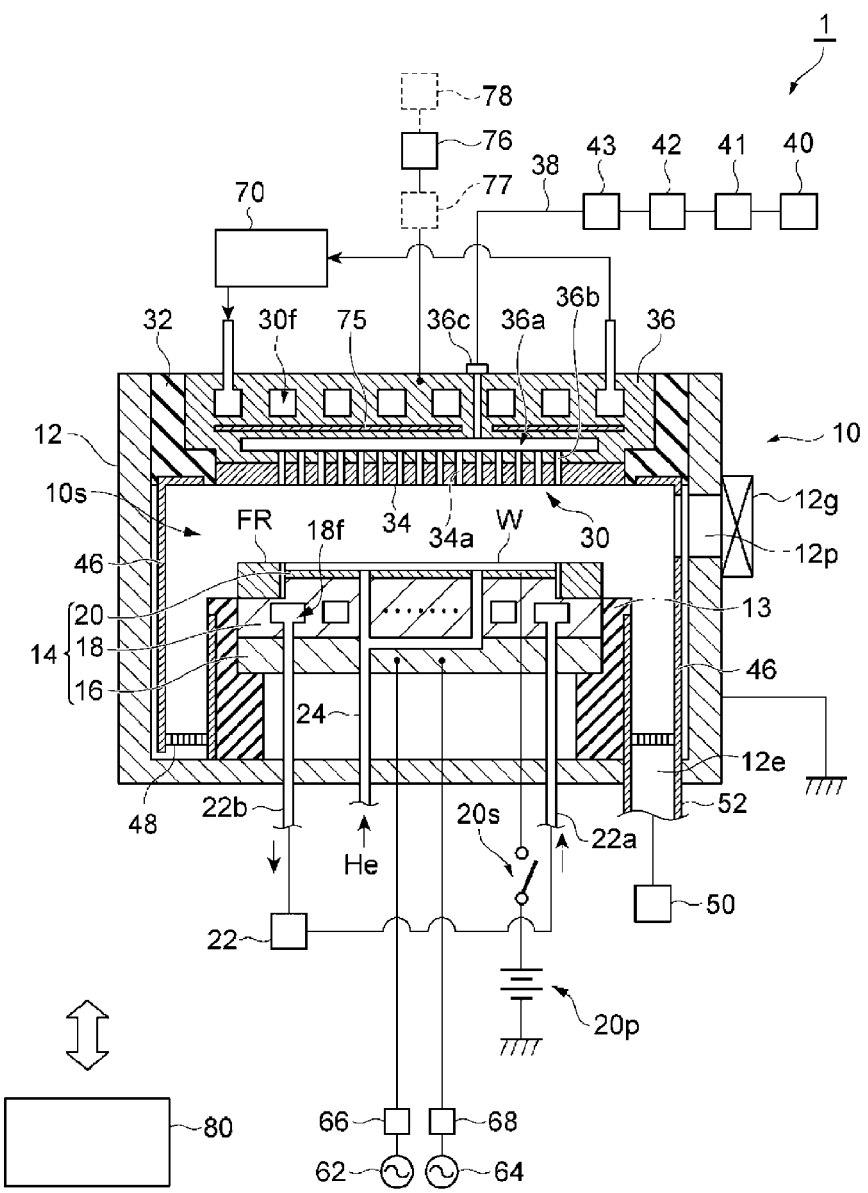
FIG. 3 is a diagram schematically illustrating an example plasma processing apparatus which can be used to perform the plasma processing method shown in FIG. 1.

In the method MT, etching of the film is performed by using a plasma processing apparatus. FIG. 3 is a diagram schematically illustrating an example of the plasma processing apparatus which can be used to perform the plasma processing method shown in FIG. 1. A plasma processing apparatus 1 shown in FIG. 3 is a capacitively coupled plasma processing apparatus. The plasma processing apparatus 1 is equipped with a chamber 10. The chamber 10 has an internal space 10s therein.

The chamber 10 includes a chamber main body 12. The chamber main body 12 has a substantially cylindrical shape. The internal space 10s is provided within the chamber main body 12. The chamber main body 12 is made of, by way of example, but not limitation, aluminum. An inner wall surface of the chamber main body 12 is treated with a corrosion-resistant film. The corrosion-resistant film may be a film formed of ceramic such as aluminum oxide or yttrium oxide.

A passage 12p is formed at a sidewall of the chamber main body 12. The substrate W passes through the passage 12p when it is transferred between the internal space 10s and the outside of the chamber 10. The passage 12p is opened or closed by a gate valve 12g. The gate valve 12g is provided along the sidewall of the chamber main body 12.

A supporting member 13 is provided on a bottom portion of the chamber main body 12. The supporting member 13 is made of an insulating material. The supporting member 13 has a substantially cylindrical shape. Within the internal space 10s, the supporting member 13 is extended upwards from the bottom portion of the chamber main body 12. The supporting member 13 supports a supporting table 14. The supporting table 14 is provided within the internal space 10s. The supporting table 14 is configured to support the substrate W within the internal space 10s.

The supporting table 14 is equipped with a lower electrode 18 and an electrostatic chuck 20. The supporting table 14 may be further equipped with an electrode plate 16. The electrode plate 16 is made of a conductor such as, but not limited to, aluminum and has a substantially disk shape. The lower electrode 18 is provided on the electrode plate 16. The lower electrode 18 is made of a conductor such as, but not limited to, aluminum and has a substantially disk shape. The lower electrode 18 is electrically connected with the electrode plate 16.

The electrostatic chuck 20 is provided on the lower electrode 18. The substrate W is placed on a top surface of the electrostatic chuck 20. The electrostatic chuck 20 includes a main body and an electrode. The main body of the electrostatic chuck 20 is formed of a dielectric material. The electrode of the electrostatic chuck 20 is a film-shaped electrode and provided within the main body of the electrostatic chuck 20. The electrode of the electrostatic chuck 20 is connected to a DC power supply 20p via a switch 20s. If a voltage is applied to the electrode of the electrostatic chuck 20 from the DC power supply 20p, an electrostatic attracting force is generated between the electrostatic chuck 20 and substrate W. The substrate W is attracted to and held by the electrostatic chuck 20 by the generated electrostatic attracting force.

A focus ring FR is provided on a peripheral portion of the lower electrode 18 to surround an edge of the substrate W. The focus ring FR is configured to improve uniformity of a plasma processing upon the substrate W. The focus ring FR may be made of, but not limited to, silicon, silicon carbide or quartz.

A path 18f is formed within the lower electrode 18. A chiller unit 22 is provided at the outside of the chamber 10. The chiller unit 22 is configured to supply a heat exchange medium (for example, a coolant) into the path 18f via a pipeline 22a. The heat exchange medium supplied into the path 18l is returned back into the chiller unit 22 via a pipeline 22b. In the plasma processing apparatus 1, a temperature of the substrate W placed on the electrostatic chuck 20 is adjusted by a heat exchange between the heat exchange medium and the lower electrode 18.

The plasma processing apparatus 1 is equipped with a gas supply line 24. Through the gas supply line 24, a heat transfer gas (e.g., a He gas) from a heat transfer gas supply mechanism is supplied into a gap between the top surface of the electrostatic chuck 20 and a rear surface of the substrate W.

The plasma processing apparatus 1 is further equipped with an upper electrode 30. The upper electrode 30 is provided above the supporting table 14. The upper electrode 30 is supported at an upper portion of the chamber main body 12 with a member 32 therebetween. The member 32 is made of a material having insulation property. The upper electrode 30 and the member 32 close an upper opening of the chamber main body 12.

The upper electrode 30 may include a ceiling plate 34 and a supporting body 36. A bottom surface of the ceiling plate 34 is a surface directly facing the internal space 10s, and it forms and confines the internal space 10s. The ceiling plate 34 is formed of a conductor such as silicon or an insulator such as silicon oxide. The ceiling plate 34 is provided with multiple gas discharge holes 34a. These gas discharge holes 34a are formed through the ceiling plate 34 in a plate thickness direction.

The supporting body 36 is configured to support the ceiling plate 34 in a detachable manner, and is made of a conductive material such as, but not limited to, aluminum. A gas diffusion space 36a is provided within the supporting body 36. The supporting body 36 is provided with multiple gas holes 36b. The multiple gas holes 36b are extended downwards from the gas diffusion space 36a to communicate with the multiple gas discharge holes 34a, respectively. Further, the supporting body 36 is provided with a gas inlet port 36c. The gas inlet opening 36c is connected to the gas diffusion space 36a. A gas supply line 38 is connected to this gas inlet port 36c.

The gas supply line 38 is connected to a gas source group 40 via a valve group 41, a flow rate controller group 42 and a valve group 43. The gas source group 40 includes a plurality of gas sources. The plurality of gas sources belonging to the gas source group 40 include sources of a plurality of gases for use in the method MT. The valve group 41 and the valve group 43 include a plurality of opening/closing valves. The flow rate controller group 42 includes a plurality of flow rate controllers. Each of the flow rate controllers belonging to the flow rate controller group 42 may be a mass flow controller or a pressure control type flow rate controller. Each of the gas sources belonging to the gas source group 40 is connected to the gas supply line 38 via a corresponding opening/closing valve belonging to the valve group 41, a corresponding flow rate controller belonging to the flow rate controller group 42 and a corresponding opening/closing valve belonging to the valve group 43.

In the plasma processing apparatus 1, a shield 46 is provided along the inner wall surface of the chamber main body 12 in a detachable manner. Further, the shield 46 is also provided on an outer side surface of the supporting member 13. The shield 46 is configured to suppress an etching byproduct from adhering to the chamber main body 12. The shield 46 may be made of, by way of non-limiting example, an aluminum base member having a corrosion-resistant film formed on a surface thereof. The corrosion-resistant film may be a film formed of ceramic such as yttrium oxide.

A baffle plate 48 is provided between the supporting member 13 and the sidewall of the chamber main body 12. The baffle plate 48 may be made of, by way of example, an aluminum base member having a corrosion-resistant film formed on a surface thereof. The corrosion-resistant film may be a film formed of ceramic such as yttrium oxide. The baffle plate 48 is provided with a plurality of through holes. A gas exhaust port 12e is provided at the bottom portion of the chamber main body 12 under the baffle plate 48. The gas exhaust port 12e is connected with a gas exhaust device 50 via a gas exhaust line 52. The gas exhaust device 50 has a pressure control valve and a vacuum pump such as a turbo molecular pump.

The plasma processing apparatus 1 is further equipped with a first high frequency power supply 62 and a second high frequency power supply 64. The first high frequency power supply 62 is configured to generate a first high frequency power. The first high frequency power has a frequency suitable for plasma generation. The frequency of the first high frequency power is in a range from, e.g., 27 MHz to 100 MHz. The first high frequency power supply 62 is connected to the lower electrode 18 via a matching device 66 and the electrode plate 16. The matching device 66 is equipped with a circuit configured to match an output impedance of the first high frequency power supply 62 and an impedance at a load side (lower electrode 18 side).

The second high frequency power supply 64 is configured to generate a second high frequency power. A frequency of the second high frequency power is lower than the frequency of the first high frequency power. When the first high frequency power and the second high frequency power are used together, the second high frequency power is used as a high frequency bias power for ion attraction into the substrate W. The frequency of the second high frequency power falls within a range from, e.g., 400 kHz to 13.56 MHz. The second high frequency power supply 64 is connected to the lower electrode 18 via a matching device 68 and the electrode plate 16. The matching device 68 is equipped with a circuit configured to match an output impedance of the second high frequency power supply 64 and the impedance at the load side (lower electrode 18 side).

Figure 4:
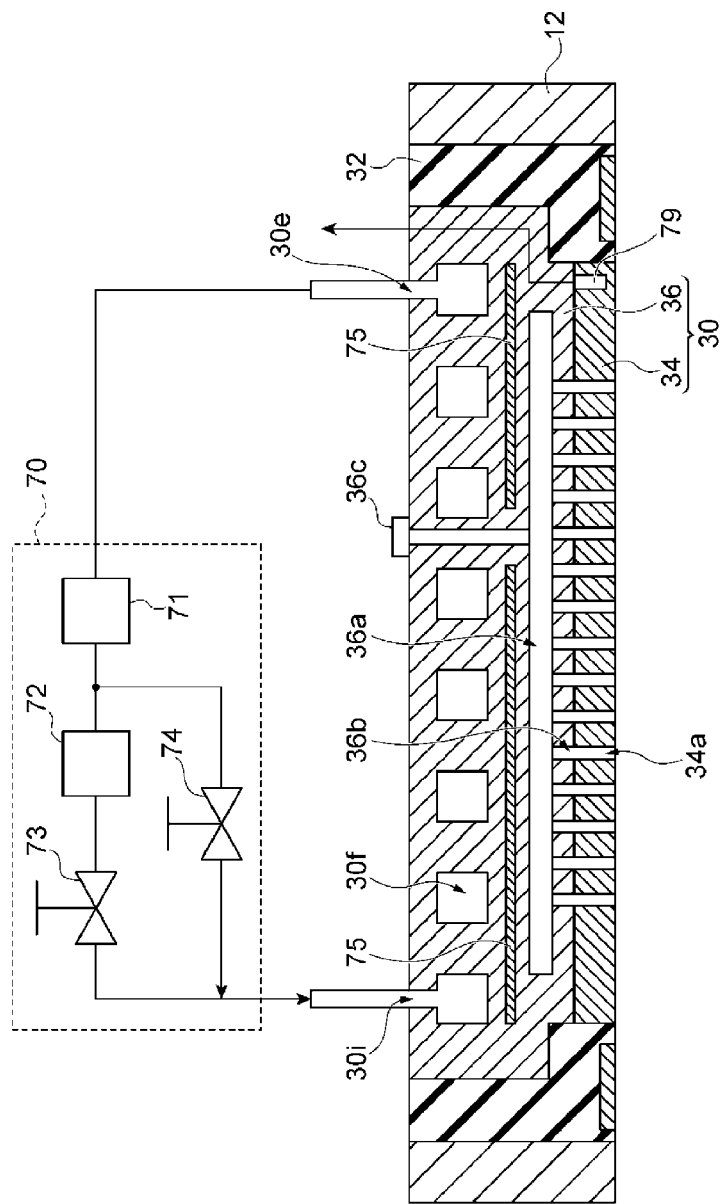
FIG. 4 is a diagram illustrating an example of an upper electrode and a chiller unit applicable to the example plasma processing apparatus shown in FIG. 3.

FIG. 4 is a diagram illustrating an example of the upper electrode and the chiller unit applicable to the example plasma processing apparatus shown in FIG. 3. Below, reference is made to FIG. 4 as well as FIG. 3. The upper electrode 30 is configured to be cooled.

By way of example, as depicted in FIG. 3 and FIG. 4, a path 30f is formed within the upper electrode 30. The path 30f has an inlet 30i and an outlet 30e, and is extended between the inlet 30i and the outlet 30e. The path 30f is formed within, for example, the supporting body 36. The path 30f is extended in a spiral shape within the upper electrode 30, for example.

A chiller unit 70 is provided at the outside of the chamber 10. An output port of the chiller unit 70 is connected to the inlet 30i. A return port of the chiller unit 70 is connected to the outlet 30e. The chiller unit 70 outputs the coolant from the output port thereof and supplies this coolant into the path 30f through the inlet 30i. The coolant supplied into the path 30f is returned back into the chiller unit 70 via the outlet 30e and the return port. That is, the coolant is circulated between the path 30f of the upper electrode 30 and the chiller unit 70. The chiller unit 70 may be configured to circulate a liquid coolant between the path 30f of the upper electrode 30 and the chiller unit 70.

Alternatively, the chiller unit 70 may be of a direct expansion type. In this case, the chiller unit 70 has a compressor 71, a condenser 72 and an expansion valve 73. The compressor 71, the condenser 72 and the expansion valve 73 are connected in sequence between the outlet 30e and the inlet 30*i* of the path 30*f*. The upper electrode 30 constitutes an evaporator. An input of the compressor 71 is connected to the outlet 30*e* of the path 30*f* via the return port of the chiller unit 70. An output of the compressor 71 is connected to an input of the condenser 72. An output of the condenser 72 is connected to an input of the expansion valve 73. An output of the expansion valve 73 is connected to the inlet 30*i* of the path 30*f* via the output port of the chiller unit 70.

The coolant outputted from the outlet 30*e* of the path 30*f* is returned back to the input of the compressor 71 to be compressed by the compressor 71. The coolant having a high pressure outputted from the compressor 71 is cooled by the condenser 72 to be liquefied. The coolant of the liquid phase outputted from the condenser 72 is decompressed in the expansion valve 73. Then, the coolant supplied into the path 30*f* from the expansion valve 73 is vaporized by absorbing heat from the upper electrode 30. Then, the coolant outputted from the path 30*f* is returned back to the input of the compressor 71. An opening degree of the expansion valve 73 is variable. As the opening degree of the expansion valve 73 is lowered, the pressure of the coolant is lowered and the vaporization temperature is lowered. Accordingly, the upper electrode 30 can be cooled to a lower temperature.

The chiller unit 70 may be further equipped with a flow dividing valve 74. The flow dividing valve 74 is connected between the compressor 71 and the inlet 30*i* of the path 30*f* to bypass the condenser 72 and the expansion valve 73. That is, an input of the flow dividing valve 74 is connected to the output of the compressor 71, and an output of the flow dividing valve 74 is connected to the inlet 30*i* of the path 30*f*. An opening degree of the flow dividing valve 74 is variable. With an increase of the opening degree of the flow dividing valve 74, the degree of dryness of the coolant supplied into the path 30*f* is increased. As the degree of dryness is higher, the heat removal effect of the coolant may be lower.

A heater 75 (resistance heating element) may be further provided within the upper electrode 30. By heating the upper electrode 30 by the heater 75, the upper electrode 30 can be set to have a higher temperature. Further, by heating the upper electrode 30 with the heater 75 while reducing the heat removal effect of the coolant by opening the flow dividing valve 74, it is possible to increase the temperature of the upper electrode 30 in a short period of time.

The plasma processing apparatus 1 may be further equipped with a temperature sensor 79. The temperature sensor 79 is configured to measure the temperature of the upper electrode 30 (for example, the ceiling plate 34). A sensor unit of the temperature sensor 79 may be provided within the upper electrode 30 (for example, the ceiling plate 34). The chiller unit 70 and the heater 75 are controlled to set the temperature of the upper electrode 30 to a designated temperature based on the temperature measured by the temperature sensor 79.

Further, the plasma processing apparatus 1 is configured to be capable of generating a bias voltage in the upper electrode 30. As depicted in FIG. 3, the upper electrode 30 (supporting body 36) is connected with a power supply 76. In case that the ceiling plate 34 is made of a conductor such as silicon, the power supply 76 is a DC power supply or a high frequency power supply. In case that the ceiling plate 34 is made of an insulator such as silicon oxide, on the other hand, the power supply 76 is a high frequency power supply. In case that the power supply 76 is the high frequency power supply, the power supply 76 is connected to the upper electrode 30 (supporting body 36) via a matching device 77.

The matching device 77 is equipped with a circuit configured to match an output impedance of the power supply 76 and an impedance at a load side of the power supply 76 (upper electrode 30 side).

In case that the power supply 76 is the DC power supply, a current sensor 78 may be connected to the power supply 76. Alternatively, the power supply 76 may incorporate the current sensor 78 therein. The current sensor 78 is configured to measure an electric current flowing in the upper electrode 30.

The plasma processing apparatus 1 may be further equipped with a control unit 80. The control unit 80 may be a computer including a processor, a storage unit such as a memory, an input device, a display device, a signal input/output interface, and so forth. The control unit 80 controls the individual components of the plasma processing apparatus 1. In the control unit 80, an operator may input a command or the like through the input device to manage the plasma processing apparatus 1. Further, in the control unit 80, an operational status of the plasma processing apparatus 1 can be visually displayed by the display device. Furthermore, control programs and recipe data are stored in the storage unit of the control unit 80. The control programs are executed by the processor of the control unit 80 to allow various processings to be performed in the plasma processing apparatus 1. As the processor of the control unit 80 executes the control programs and controls the individual components of the plasma processing apparatus 1 based on the recipe data, the method MT is performed in the plasma processing apparatus 1.

Figure 5:
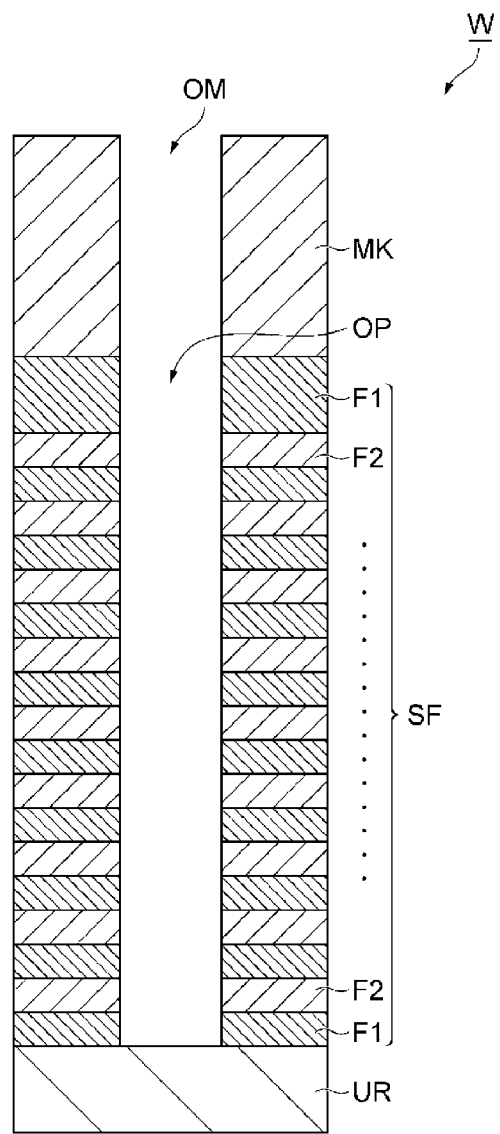
FIG. 5 is a partially enlarged cross sectional view of the example substrate after the method shown in FIG. 1 is performed.

Reference is made back to FIG. 1. Now, an example where the method MT is performed by using the plasma processing apparatus 1 will be explained. In the following description, reference is made to FIG. 5 as well as FIG. 1. FIG. 5 is a partially enlarged cross sectional view illustrating an example of the substrate after the method shown in FIG. 1 is performed.

The method MT is performed in the state that the substrate W is placed on the supporting member 14. As depicted in FIG. 1, in the method MT, a process ST1 is performed. In the process ST1, the upper electrode 30 is cooled. To elaborate, the coolant is supplied into the path 30*f* of the upper electrode 30 from the chiller unit 70. The upper electrode 30 is cooled to a temperature equal to or less than, e.g., 50° C.

In a process ST2, the film SF of the substrate W is etched. The process ST2 is performed during the process ST1. That is, the film SF is etched while the cooling of the upper electrode 30 is being performed. In the process ST2, the film SF is etched by the plasma generated within the chamber 10.

To be more specific, in the process ST2, a processing gas is supplied into the internal space 10*s*. The processing gas is supplied from one or more gas sources selected from the gas sources belonging to the gas source group 40. The processing gas is a gas for etching the film SF. In the process ST2, the gas exhaust device 50 is controlled such that a pressure within the internal space 10*s* is set to a preset pressure. In the process ST2, the chiller unit 22 is controlled such that a temperature of the supporting member 14 is set to a predetermined temperature. In the process ST2, the first high frequency power is supplied to generate the plasma of the processing gas. In the process ST2, the second high frequency power may be further supplied.

In the exemplary embodiment, the film SF contains silicon as stated above. In the process ST2 of the present exemplary embodiment, the processing gas contains carbon, hydrogen and fluorine. The processing gas may be a mixed gas including a carbon-containing gas, one or more hydrogen-containing gases and one or more fluorine-containing gases. The processing gas may include a hydrogen gas ($H_2$ gas) as the hydrogen-containing gas. The processing gas may include, as the one or more fluorine-containing gases, one or more gases in hydrofluorocarbon gas, fluorocarbon gas, nitrogen trifluoride gas and sulfur hexafluoride gas. The processing gas may further include, as the carbon-containing gas, hydrocarbon gas.

In the process ST2, the film SF is etched by chemical species such as ions and/or radicals from the plasma of the processing gas. As a result of performing the process ST2, the pattern of the mask MK is transferred to the film SF. That is, through the process ST2, openings OP continuous with the one or more openings OM is formed in the film SF, as depicted in FIG. 5. During the process ST2, an etching byproduct is generated and adheres to the wall surface forming the internal space 10s to become a deposit. The deposit also adheres to the ceiling plate 34 of the upper electrode 30.

In the method MT, a process ST3 is performed during the process ST2 to reduce the amount of the deposit on the ceiling plate 34 of the upper electrode 30 or to remove the deposit from the ceiling plate 34 of the upper electrode 30. That is, the process ST3 is performed while the process ST1 is being performed. In the process ST3, the negative bias voltage is generated in the upper electrode 30.

In case that the power supply 76 is the DC power supply, the negative DC voltage is applied to the upper electrode 30 from the power supply 76 in the process ST3. In case that the power supply 76 is the high frequency power supply, on the other hand, the high frequency power is applied to the upper electrode 30 from the power supply 76 in the process ST3 to generate the negative bias voltage (self-bias voltage Vdc) in the upper electrode 30.

In the method MT, the process ST3 is performed during the etching of the film SF (during the process ST2). Accordingly, during the process ST2, the negative bias voltage is generated in the upper electrode 30, so that positive ions in the plasma are accelerated toward the upper electrode 30. Further, in the process ST2, the upper electrode 30 is being cooled. Accordingly, the amount of the chemical species capable of etching the deposit is increased around the upper electrode 30, so that the deposit adhering to the upper electrode 30 is efficiently etched. Thus, according to the method MT, the amount of the deposit attached to the upper electrode 30 is reduced, or the deposit is removed from the upper electrode 30.

Figure 6:
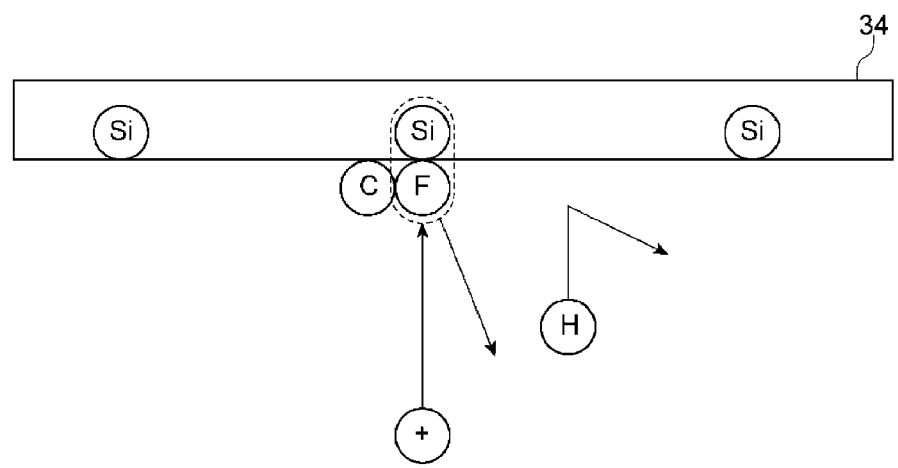
FIG. 6 is a diagram illustrating an example reaction of chemical species related to removal of a deposit on the upper electrode when a temperature of the upper electrode is relatively high.
Figure 7:
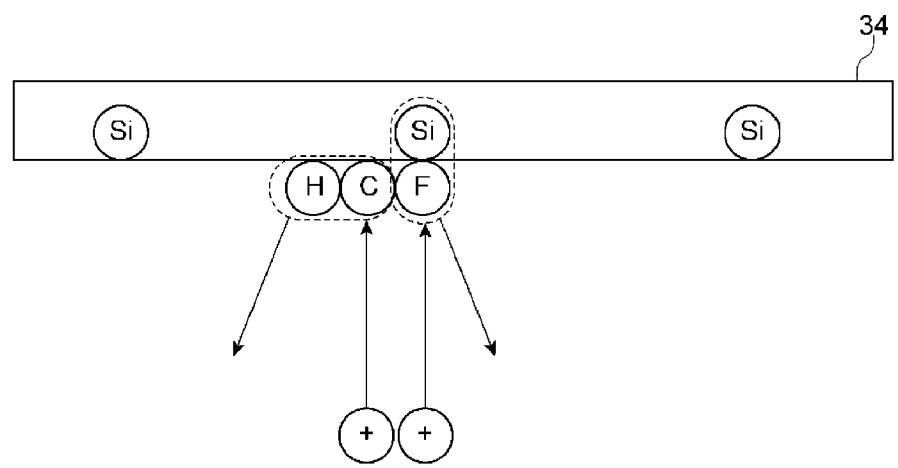
FIG. 7 is a diagram illustrating an example reaction of chemical species related to the removal of the deposit on the upper electrode when the temperature of the upper electrode is relatively low.

FIG. 6 is a diagram illustrating an example reaction of chemical species related to the removal of the deposit on the upper electrode in case that the temperature of the upper electrode is relatively high. FIG. 7 is a diagram illustrating an example reaction of chemical species related to the removal of the deposit on the upper electrode in case that the temperature of the upper electrode is relatively low. In FIG. 6 and FIG. 7, encircled 'Si' represents silicon. In FIG. 6 and FIG. 7, encircled 'C' indicates carbon. In FIG. 6 and FIG. 7, encircled 'F' represents fluorine. In FIG. 6 and FIG. 7, encircled 'H' indicates a hydrogen compound. In FIG. 6 and FIG. 7, encircled '+' represents positive ions. Below, referring to FIG. 6 and FIG. 7, an example case where the ceiling plate 34 of the upper electrode 30 contains silicon and the processing gas used in the process ST2 contains hydrogen, fluorine and carbon is considered.

If the processing gas used in the process ST2 includes hydrogen, fluorine and carbon, chemical species containing carbon and fluorine adheres to the ceiling plate 34 of the upper electrode 30 as the deposit, as shown in FIG. 6 and FIG. 7. In the state that the negative bias voltage is generated in the upper electrode 30, the positive ions are attracted toward the upper electrode 30 from the plasma, as illustrated in FIG. 6 and FIG. 7. The silicon of the ceiling plate 34 and the fluorine in the deposit are made to react with each other by energy of the positive ions attracted to the upper electrode 30, so that silicon fluoride is generated. The generated silicon fluoride is exhausted away from the upper electrode 30. As a result, the amount of the fluorine in the deposit is reduced.

If the temperature of the upper electrode 30 is relatively high, kinetic energy of the hydrogen compound is high, and the amount of the hydrogen compound adhering to the upper electrode 30 and/or the deposit is decreased. As a result, as shown in FIG. 6, the carbon in the deposit is left on the surface of the ceiling plate 34. Meanwhile, in the state that the upper electrode 30 is cooled through the process ST1, the kinetic energy of the hydrogen compound is reduced, and the amount of the hydrogen compound adhering to the upper electrode 30 and/or the deposit is increased. The carbon in the deposit and the hydrogen compound (or the hydrogen in the hydrogen compound) react with each other by the energy of the positive ions attracted to the upper electrode 30, so that hydrocarbon is generated, as shown in FIG. 7. The generated hydrocarbon is exhausted away from the upper electrode 30. As a result, the amount of the carbon in the deposit is reduced. Thus, by performing the process ST2 in the state that the upper electrode 30 is cooled and the negative bias voltage is generated in the upper electrode 30, the amount of the deposit adhering to the upper electrode 30 is reduced or the deposit is removed from the upper electrode 30.

Referring back to FIG. 1, the method MT may further include a process ST4. The process ST4 is performed during the process ST3. In the process ST4, the electric current flowing in the upper electrode 30 is measured. The electric current flowing in the upper electrode 30 is measured by a sensor 78. The deposit adhering to the upper electrode 30 reduces the electric current flowing in the upper electrode 30. Accordingly, by measuring the electric current flowing in the upper electrode 30, it is possible to detect the amount of the deposit attached to the upper electrode 30.

So far, the various exemplary embodiments have been described. However, it should be noted that the exemplary embodiments are not limiting and various changes and modifications may be made. By way of example, the plasma processing apparatus which is used in the method MT may be any of various types as long as it is a capacitively coupled plasma processing apparatus in which an upper electrode is capable of generating the negative bias voltage and the upper electrode can be cooled.

Figure 8:
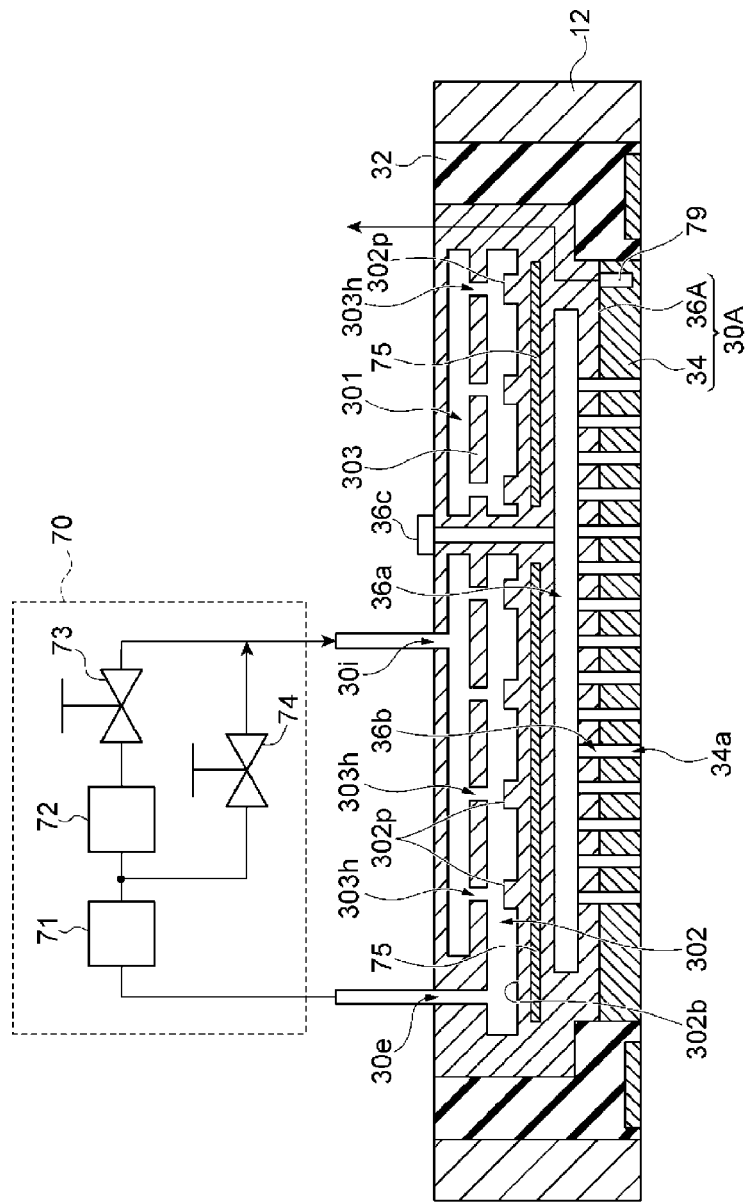
FIG. 8 is a diagram illustrating an example of an upper electrode of the plasma processing apparatus which can be used to perform the plasma processing method shown in FIG. 1.

The plasma processing apparatus 1 may be equipped with an upper electrode 30A shown in FIG. 8, instead of the upper electrode 30. FIG. 8 is a diagram illustrating an example of an upper electrode of a plasma processing apparatus which can be used to perform the plasma processing method of FIG. 1. The upper electrode 30A includes the ceiling plate 34 and a supporting body 36A. The supporting body 36A is different from the supporting body 36 of the upper electrode 30. That is, the upper electrode 30A is different from the upper electrode 30 in the structure of the supporting body.

Like the supporting body 36, the supporting body 36A has the gas diffusion space 36a and the gas holes 36b. The path 30f is not formed in the supporting body 36A. The supporting body 36A has a first space 301 and a second space 302 formed therein. The first space 301 is formed and extended above the second space 302. When viewed from the top, each of the first space 301 and the second space 302 has a substantially circular plan shape. A wall portion 303 is extended between the first space 301 and the second space 302. The wall portion 303 is extended in the horizontal direction.

The first space 301 is connected to the inlet 30$i$, and the output port of the chiller unit 70 is connected to the inlet 30$i$. A path which provides the inlet 30$i$ is extended upwards from the first space 301 within the supporting body 36A. That is, the coolant outputted from the chiller unit 70 is supplied into the first space 301 from above.

A bottom surface 302$b$ which forms and confines the second space 302 is provided with a multiple number of protrusions 302$p$. Each of the multiple number of protrusions 302$p$ is projected from a peripheral region of the bottom surface 302$b$. The protrusions 302$p$ are dispersed two-dimensionally within the bottom surface 302$b$. The wall portion 303 is provided with multiple through holes 303$h$. Each of the multiple through holes 303$h$ is extended in the vertical direction to allow the first space 301 and the second space 302 to communicate with each other. A lower end of each of the multiple through holes 303$h$ faces a corresponding one of the multiple number of protrusions 302$p$. As the coolant supplied into the first space 301 from the chiller unit 70 is discharged toward the multiple number of protrusions 302$p$ via the multiple through holes 303$h$, the coolant is supplied into the second space 302.

The second space 302 is connected to the outlet 30$e$, and the output 30$e$ is connected to the return port of the chiller unit 70. A path which provides the outlet 30$e$ is extended upwards from the second space 302 within the supporting body 36A. The coolant which is vaporized after being supplied into the second space 302 is exhausted upwards from the second space 302 to be returned back into the chiller unit 70.

Now, experiments conducted to evaluate the method MT will be explained. The following experiments, however, do not limit the present disclosure.

First Experiment

In a first experiment, a first sample to a third sample are prepared. Each of the first sample to third sample has a film made of polycrystalline silicon. In the first experiment, a capacitively coupled plasma processing apparatus is used. The plasma processing apparatus used in the first experiment has the same configuration as that of the plasma processing apparatus 1 except that it does not have a function of cooling the upper electrode 30 and a function of generating the bias voltage in the upper electrode 30. In the first experiment, each of the first sample to the third sample is placed on the supporting table, and a plasma processing is performed in the internal space of the plasma processing apparatus. In the plasma processing upon the first sample to the third sample, a mixed gas including a fluorine compound gas, a CF-based gas and a hydrogen-containing gas is used as the processing gas. In the plasma processing upon the first sample, a self-bias voltage of the lower electrode is set to −1260 V. In the plasma processing upon the second sample, the self-bias voltage of the lower electrode is set to −1770 V. In the plasma processing upon the third sample, the self-bias voltage of the lower electrode is set to −1835 V. The self-bias voltage is set by adjusting the power level of the second high frequency power. Below, other conditions for the plasma processings upon the first sample to the third sample are specified.

<Conditions for Plasma Processings Upon First Sample to Third Sample>
Temperature of supporting table: 15° C.
Pressure within internal space of chamber: 20 mTorr (2.666 Pa)
First high frequency power: 40 MHz, 1000 W
Second high frequency power: 400 kHz As a result of the plasma processing upon the first sample, the film is not etched, and the deposit is formed on the film. As a result of the plasma processing upon the second sample, the film is not etched and the deposit is formed on the film. However, the amount of the deposit on the film of the second sample is smaller than the amount of the deposit formed on the film of the first sample. As a result of the plasma processing upon the third sample, the deposit is not formed on the film, and the film is found to be etched. From the result of the first experiment, it is found out that the amount of the deposit can be reduced by adjusting the negative bias voltage applied to a target object having the deposit formed thereon. Therefore, it is deemed that the amount of the deposit attached on the upper electrode can be reduced by generating the negative bias voltage in the upper electrode during the plasma processing (plasma etching).

Second Experiment

In the second experiment, a fourth sample to an eighth sample are prepared. Each of the fourth sample to the eighth sample has a film made of polycrystalline silicon. In the second experiment, the same plasma processing apparatus as used in the first experiment is utilized. In the second experiment, each of the fourth sample to the eighth sample is placed on the supporting table, and a plasma processing is performed thereon. In the plasma processing upon the fourth sample to the eighth sample, the same processing gas as used in the first experiment is utilized. In the plasma processing upon each of the fourth sample to the eighth sample, the second high frequency power is not supplied in order to set an absolute value of the self-bias voltage in the lower electrode to be low. During the plasma processing of the second experiment, the temperatures of the fourth sample to the eighth sample are set to 50° C., 25° C., 15° C., 0° C., −37° C., respectively. Below, other conditions for the plasma processing upon the fourth sample to the eighth sample are specified.

<Conditions for Plasma Processing Upon Fourth Sample to Eighth Sample>
Pressure within internal space of chamber: 20 mTorr (2.666 Pa)
First high frequency power: 40 MHz, 1500 W As a result of the plasma processing of the second experiment, the deposit is found to be attached on the fourth sample and the fifth sample. As a result of the plasma processing of the second experiment, the deposit is partially formed on the surface of the sixth sample. As a result of the plasma processing of the second experiment, no deposit is formed on the seventh sample and the eighth sample. It is found out from the results of the second experiment that by setting the temperature of the target object to be low, the amount of the deposit on the target object can be reduced, even if the absolute value of the self-bias voltage in the target object is low. Accordingly, it is deemed that the amount of the deposit adhering to the upper electrode can be reduced by cooling the upper electrode during the plasma etching. Furthermore, it is found out from the results of the first experiment and the second experiment that the amount of the deposit formed on the upper electrode can be reduced more efficiently by cooling the upper electrode during the plasma etching of the film and generating the negative bias voltage in the upper electrode.

Third Experiment

In the third experiment, a plasma processing is performed by using the plasma processing apparatus 1. In the plasma processing of the third experiment, the same processing gas as that used in the first experiment is used. In the third experiment, a sample is placed on the supporting table 14, and the plasma processing (plasma etching) is performed under five different conditions regarding the temperature of the upper electrode 30. That is, under the five different conditions, the temperature of the upper electrode 30 is set to −50° C., −10° C., 50° C., 100° C., 150° C., respectively. Below, other processing conditions for the third experiment are specified.

<Conditions for Plasma Processing in Third Experiment>
Pressure within internal space of chamber: 20 mTorr (2.666 Pa)
First high frequency power: 40 MHz, 4500 W
Second high frequency power: 400 kHz, 7 kW
DC voltage applied to the upper electrode 30: −1200 V As a result of the third experiment, when the temperature of the upper electrode 30 is 150° C., the deposit is found to be formed on the upper electrode 30. When the temperature of the upper electrode 30 is 100° C., the deposit is found to be partially formed on a part of the surface of the upper electrode 30. When the temperature of the upper electrode 30 is 50° C., −10° C. and −50° C., no deposit is formed on the upper electrode 30. Accordingly, it is found out that the amount of the deposit adhering to the upper electrode 30 can be reduced or the deposit can be removed from the upper electrode 30 by cooling the upper electrode 30 during the plasma etching of the film and generating the negative bias voltage in the upper electrode 30.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A plasma processing method performed in a capacitively coupled plasma processing apparatus, the plasma processing method comprising:
cooling an upper electrode of the plasma processing apparatus in which a chamber incorporating therein a supporting table including a lower electrode is provided and the upper electrode is provided above the supporting table;
etching a film of a substrate placed on the supporting table by plasma generated from a processing gas including carbon, hydrogen and fluorine within the chamber during the cooling of the upper electrode such that a deposit is generated on the upper electrode and an amount of a hydrogen compound adhering to the upper electrode is increased; and
generating a negative bias voltage in the upper electrode during the etching of the film such that the hydrogen compound and a carbon in the deposit react with each other by an energy of positive ions attracted to the upper electrode and hydrocarbon is generated,
wherein the upper electrode is cooled to a temperature equal to or less than 50° C.

2. The plasma processing method of claim 1,
wherein a path having an inlet and an outlet is formed within the upper electrode, and the upper electrode constitutes an evaporator,
a compressor, a condenser and an expansion valve are connected in sequence between the outlet and the inlet of the path, and
a coolant is supplied into the path via the compressor, the condenser and the expansion valve in the cooling of the upper electrode.

3. The plasma processing method of claim 1, further comprising:
measuring an electric current flowing in the upper electrode.

4. The plasma processing method of claim 1,
wherein the film contains silicon.

5. The plasma processing method of claim 4,
wherein the film is a multilayered film having multiple silicon oxide films and multiple silicon nitride films alternately stacked on top of each other.

6. The plasma processing method of claim 1,
wherein the upper electrode comprises a ceiling plate configured to form and confine a space within the chamber,
the ceiling plate is made of silicon, and
in the generating of the negative bias voltage, a negative DC voltage is applied to the upper electrode or a high frequency power is supplied to the upper electrode such that the negative bias voltage is generated in the upper electrode.

7. The plasma processing method of claim 1,
wherein the upper electrode comprises a ceiling plate configured to form and confine a space within the chamber,
the ceiling plate is made of silicon oxide, and
in the generating of the negative bias voltage, a high frequency power is supplied to the upper electrode such that the negative bias voltage is generated in the upper electrode.

8. The plasma processing method of claim 1,
wherein the upper electrode is cooled to a temperature equal to or less than −10° C.

9. The plasma processing method of claim 1,
wherein the processing gas is a mixed gas including a carbon-containing gas, a hydrogen-containing gas and one or more fluorine-containing gases,
the carbon-containing gas is a hydrocarbon gas,
the hydrogen-containing gas is hydrogen gas, and
the one or more fluorine-containing gases is one or more gases in hydrofluorocarbon gas, fluorocarbon gas, nitrogen trifluoride gas and sulfur hexafluoride gas.

* * * * *

UNITED STATES PATENT AND TRADEMARK OFFICE
CERTIFICATE OF CORRECTION

PATENT NO. : 10,784,088 B2
APPLICATION NO. : 16/390323
DATED : September 22, 2020
INVENTOR(S) : Dai Igarashi et al.

Page 1 of 1

It is certified that error appears in the above-identified patent and that said Letters Patent is hereby corrected as shown below:

In the Specification

Column 4, Line 65, "181" should be -- 18f --.

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*